United States Patent [19]
Brockett et al.

[11] Patent Number: 5,698,819
[45] Date of Patent: Dec. 16, 1997

[54] SURFACE MOUNT ELECTRONIC REED SWITCH COMPONENT

[75] Inventors: Stephen Neil Brockett, Crowborough; Colin Stratford, Croydon, both of England

[73] Assignee: Standex International Corporation, Salem, Mass.

[21] Appl. No.: 420,061

[22] Filed: Apr. 11, 1995

[30] Foreign Application Priority Data

Feb. 23, 1995 [GB] United Kingdom ............ 9503673

[51] Int. Cl.$^6$ .................. H02G 3/08; H05K 7/10
[52] U.S. Cl. .................. 174/52.1; 361/767
[58] Field of Search .................. 174/52.1, 52.4, 174/52.5, 138 G, 251, 259, 260, 261; 361/760, 761, 767, 772, 773; 257/734, 735; 335/151, 154, 156, 199, 202

[56] References Cited

U.S. PATENT DOCUMENTS

| | | |
|---|---|---|
| 2,392,311 | 1/1946 | Christopher . |
| 3,222,486 | 12/1965 | Moriyama et al. . |
| 3,249,728 | 5/1966 | Sasamoto et al. . |
| 3,302,143 | 1/1967 | Harkenrider ............ 335/154 |
| 3,663,777 | 5/1972 | Steinmetz et al. . |
| 4,134,088 | 1/1979 | Asbell et al. ............ 335/154 |
| 4,136,321 | 1/1979 | Smith . |
| 4,145,805 | 3/1979 | Smith . |
| 4,177,439 | 12/1979 | Smith . |
| 4,232,281 | 11/1980 | Smith . |
| 4,254,448 | 3/1981 | Martyniak . |
| 4,286,241 | 8/1981 | Olivenvaum et al. ............ 335/154 |
| 4,339,644 | 7/1982 | Aldinger et al. . |
| 4,420,732 | 12/1983 | Jin . |
| 4,495,480 | 1/1985 | Martin et al. ............ 335/199 |
| 4,588,974 | 5/1986 | Hill . |
| 4,611,092 | 9/1986 | Pederson, Jr. et al. . |
| 4,831,724 | 5/1989 | Elliott ............ 174/52.4 |
| 5,128,834 | 7/1992 | Kaschle ............ 335/154 |
| 5,291,375 | 3/1994 | Mukai ............ 174/261 |
| 5,453,582 | 9/1995 | Amano et al. ............ 174/261 |

FOREIGN PATENT DOCUMENTS

| | | |
|---|---|---|
| 0131492 | 1/1985 | European Pat. Off. . |
| 2253521 | 9/1992 | United Kingdom . |

OTHER PUBLICATIONS

Copy of British Search Report in Application 9503673.7.

Primary Examiner—Mark H. Paschall
Assistant Examiner—Sam Paik
Attorney, Agent, or Firm—Wood, Herron & Evans, L.L.P.

[57] ABSTRACT

A surface mount electronic reed switch component (10) is provided having a rod-shaped pad element (40) connected in transverse relationship to the outer end (30) of each switch lead (12, 14) of the reed switch (10) to provide a stable surface mounting foot without bending the leads (12,14) to thus avoid adversely affecting the switch gap (28) defined by the inner ends (22,24) of the leads (12,14). Element (40) may be of round, square, rectangular or tubular cross-section.

48 Claims, 1 Drawing Sheet ns to surface mount electronic
components, and more particularly, to surface mount reed
switches.

SURFACE MOUNT ELECTRONIC REED SWITCH COMPONENT

BACKGROUND OF THE INVENTION

The present invention relates to surface mount electronic
components, and more particularly, to surface mount reed
switches.

By way of background, a conventional reed switch
includes a pair of conductive switch contacts encapsulated
within an elongated glass body which may have a cylindrical
or rectangular cross-section extending along a longitudinal
axis. The switch contacts are held in spaced-apart relationship to opposite sides of the longitudinal axis to define a
carefully controlled gap therebetween. The ampere-turn or
sensitivity rating of the reed switch corresponds to that gap.
Typically, the switch contacts are defined at canted inner
ends of a pair of conductive switch leads which extend along
the longitudinal axis and out of the hermetically sealed glass
body at opposed ends of the body.

The exposed outer ends of the leads may be electrically
connected to conductive traces on a printed circuit (PC)
board, for example, to interconnect with other electronic
components. To this end, it has been conventional to form a
90° bend in the exposed end of each lead so as to be directed
towards the PC board. The lead is thus receivable through a
conductive hole formed in the board after which the lead
may be soldered in place.

To more densely and closely pack electronic components
on PC boards, through-holes in the PC board are eliminated.
Instead, surface mount technology (SMT) has been developed. With SMT technology, a small conductive pad is
provided on the surface of the PC board and the lead of the
electronic component is soldered directly to that pad without
extending through the PC board. To this end, the leads of the
electronic components may be bent twice at oppositely
directed 90° angles to define a Z-shaped leg. The outermost
end of the leg defines a flat or planar surface mounting foot
which rests directly in confronting relationship with the
small contact pad on the surface of the PC board to make
electrical contact therewith while also holding the electronic
component above the board surface. Thereafter the foot and
contact pad are soldered together to secure the electrical
connection.

Bending of the leads can place a stress on the associated
electronic component. With respect to reed switches in
particular, as each switch lead is bent to form the surface
mounting foot, the result of stresses induced by bending may
be seen at the inner end of the switch leads. Such stresses
may adversely affect the hermetic sealing characteristics of
the glass body or the predefined gap between the switch
contacts causing erratic or inadequate performance of the
reed switch.

In addition to the foregoing, because the surface mounting
foot is typically defined by the lead itself, the width of the
foot is usually relatively narrow. In reed switches, for
example, where only two such feet are provided at extreme
ends of the component body and are parallel to, but spaced
from, the longitudinal axis thereof, the two narrow feet do
not provide much stability to the reed switch resting on the
PC board before it is soldered in place.

SUMMARY OF THE INVENTION

It is an object of the present invention to provide a surface
mount electronic component such as a surface mount reed
switch which overcomes the above-mentioned problems. To
this end, and in accordance with a preferred embodiment, a
conductive pad element is connected, such as by soldering
or welding, to the outer ends of each lead. The bottom
surface of the pad element rests on the PC board to thus
simulate a surface mounting foot while the body of the pad
element serves to space the lead, and thus the reed switch,
from the PC board surface. As a result, bending of the leads
is not necessary in order to facilitate surface mounting and
so the stresses formerly associated with such bending are
reduced or eliminated.

The pad element may advantageously be formed from a
short length of rod which is placed transverse to the outer
end of its associated lead. As a consequence, the length of
the rod may exceed the width of the lead to thus provide a
more stable mounting surface when resting on a PC board,
for example. The rod may, for example, be of round, square,
rectangular or tubular cross-section.

By virtue of the foregoing, there is thus provided a surface
mount electronic component, such as a surface mount reed
switch, in which lead bending stresses may be eliminated,
and in which a stable platform is provided to support the
component prior to soldering on the PC board. These and
other objects and advantages of the present invention shall
be made apparent from the accompanying drawings and the
description thereof.

BRIEF DESCRIPTION OF THE DRAWINGS

The accompanying drawings, which are incorporated in
and constitute a part of this specification, illustrate an
embodiment of the invention, and together with the general
description of the invention given above, and the detailed
description of the embodiment given below, serve to explain
the principles of the present invention.

DETAILED DESCRIPTION OF THE DRAWINGS

Figure 1:
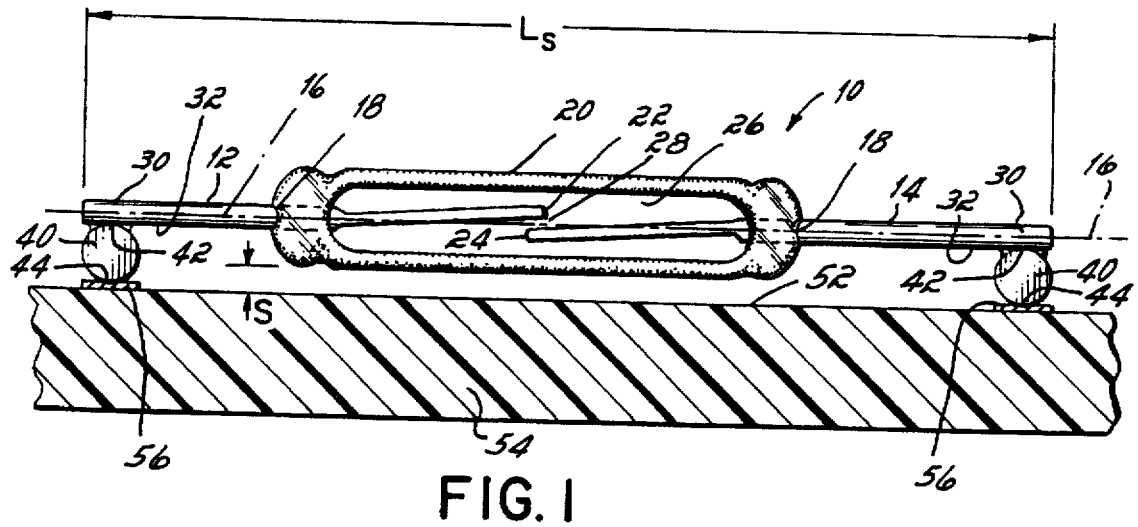
FIG. 1 is a cross-sectional side view of a surface mount
electronic reed switch component constructed in accordance
with the principles of the present invention and setting on a
PC board.

With reference to FIG. 1, there is shown an exemplary
embodiment of an electronic reed switch component 10 for
purposes of explaining the principles of the present invention. Reed switch 10 includes a pair of conductive Alloy 51
nickel iron switch leads 12, 14 extending along longitudinal
axis 16 out from opposite, hermetically sealed ends 18 of
tubular, soda lime glass encapsulating body 20. The inner
ends 22,24 of switch leads 12,14 are canted within cavity 26
of body 20 so as to be disposed to opposite sides of
longitudinal axis 16 as seen in FIG. 1 to define a gap 28
between. The spacing of gap 28 defines the ampere-turn or
sensitivity rating of reed switch 10 and thus must be carefully controlled. Typical gap spacing is between about
one-half and three thousandths inch (about 0.015 and 0.08
millimeters).

Electronic component 10 is adapted for surface mounting
without requiring that outer ends 30 of leads 12,14 be bent
thus minimizing bending stresses that may adversely affect
the hermetic seal of body 20 or spacing of gap 28. To this
end, attached to the underside 32 of each switch lead outer
end 30 is a pad element 40 having a thickness defined by the
spacing between its upper and lower surface portions 42 and 44 equal to the elevation of leads 12,14 from the plane of surface 52 of PC board 54 to which component 10 is usually connected by means of fast curing epoxy. That thickness also corresponds to the spacing or clearance (S) between body 20 and surface 52. Pad element upper surface portion 42 is mechanically and electrically attached to switch lead underside 32 such as by soldering or welding, the latter being advantageous, whereby each pad element 40 depends or projects downwardly below longitudinal axis 16 and towards PC board surface 52 as shown in FIG. 1. Lower surface portion 44 of each pad element 40 may rest directly on a respective contact pad 56 associated with PC board 54 to thus function as a surface mounting foot. Soldering with conventional or other techniques such as vapor phase infrared or the like will subsequently electrically and mechanically secure or anchor pad element 40 to contact pad 56.

By providing pad elements 40 rather than bending leads 12, 14, stresses of bending are reduced or eliminated thereby avoiding adverse affects on the hermetic seal of body 20 or gap 28 as was otherwise a problem associated with prior art surface mount reed switches. Provision of pad elements 40 may be seen to have other advantages as well. By way of example, and not limitation, pad elements 40 are attached to leads 12, 14 such that the overall length ($L_s$) of component 10 is about 0.7 to 1.0 inches (about 17.7 to 25.3 mm). However, pad elements 40 may be attached to switch leads 12, 14 anywhere along the extent of their outer ends 30 as desired. As a consequence, there is greater flexibility in defining $L_s$ so as to achieve any desired longitudinal spacing between a mounting foot surface and glass body 20. Such flexibility is of significant advantage when different size components are considered.

Additionally, greater flexibility in defining clearance (S) of body 20 relative to PC board surface 52 is provided by the present invention. To this end, such clearance may be preselected simply by selection of a pad element having a thickness corresponding to the desired spacing, rather than undertaking more difficult or costly machine set-up changes to adjust bend locations.

Figure 2:
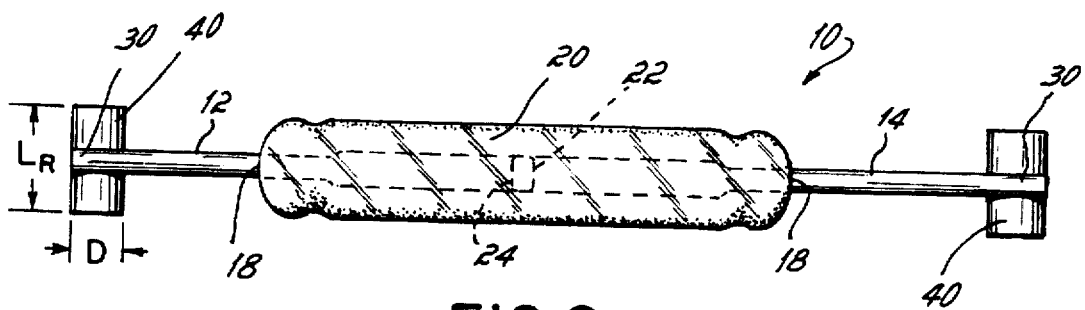
FIG. 2 is a top view of the component of FIG. 1.

Pad elements 40 may advantageously be rod-shaped members and may thus be easily provided as a length or piece of conductive copper nickel (such as 45–55) or any other highly conductive wire or rod. As seen in FIG. 2, the rod-shaped piece 40 may be circular or round in cross-section, although other cross-sections such as square, rectangular or tubular may also be used. Also Grade 52 vacumet nickel iron or any similar magnetic material may be used for pad elements 40 instead of copper nickel which will increase the sensitivity of the switch reduced by cropping the switch leads. Rod 40 may have a diameter D of about 0.050 to 0.060 inch (about 1.3 to 1.5 mm) to define the thickness thereof, although other diameters may be selected depending on the spacing (S) desired between body 20 and PC board 54 as discussed above.

In a further feature, rod-like pad elements 40 are attached to switch leads 12,14 in transverse relationship as seen in FIG. 2 so as to define a surface mounting foot that is substantially wider than the width of leads 12,14. This substantially wider foot provides a stable surface mounting foot as compared to that typically available where the leads themselves are merely bent to form the foot. To this end, the length $L_R$ of each rod piece 40 may, for example, be about 0.085 inch (about 2.2 mm) to thus define a surface mounting foot that is as much as twice as wide as the foot provided by a bent lead end. Other lengths may be selected as desired or necessary for the particular electronic component involved.

In use, the component 10 is formed using conventional techniques. The leads 12,14 need not be bent, however, to be adapted for surface mounting. Instead, a pad element 40, such as a length of rod, is situated transversely along the outer end 30 of each lead 12,14 and welded thereto such that a lower surface 44 of the rod desirably defines a surface mounting foot. The rod may be a long piece cut to length after welding, or may be cut to the preselected length and then attached to the lead 12 or 14. The component is then able to be surface mounted to PC board 54 by placing each pad element 40 on a respective pad contact 56 of the board 54 after which solder may be applied as is conventional.

By virtue of the foregoing there is thus provided an electronic component, such as a reed switch, which is SMT compatible without certain drawbacks associated with prior art SMT components. To this end, a surface mount electronic component is provided which does not require unnecessary bending stresses on the leads thereof, and which can provide a stable mounting surface for the component when it is resting on the PC board surface prior to being soldered into place.

Figure 3A:
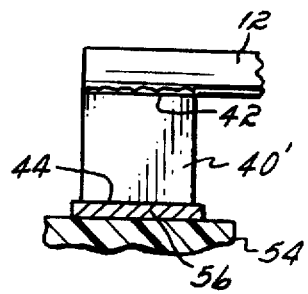
FIGS. 3A, 3B and 3C are cross-sectional side views of
alternative embodiments of the pad element illustrated in
FIG. 1.
Figure 3B:
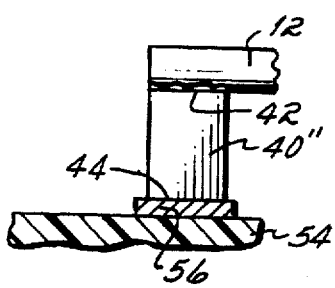
Figure 3C:
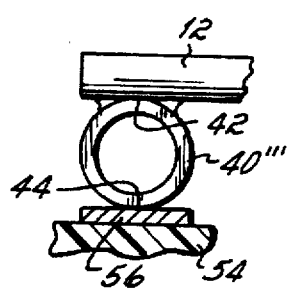

While the illustrative embodiment has been described in considerable detail, additional advantages and modifications will readily appear to those skilled in the art. For example, although pad elements 40 are described as being formed separately from leads 12,14 and subsequently attached thereto, leads 12,14 could be made with pad elements 40 formed integrally thereon. Further, although pad elements 40 are described as being rod-shaped pieces, they may also be provided by differently shaped or formed conductive members which eliminate the need to bend leads 12,14. For example, as seen in FIG. 3A, pad element 40' may have a square cross section. Or, as seen in FIG. 3B, pad element 40" may have a rectangular cross-section. The pad element may be solid, as shown in FIGS. 1, 3A and 3B, or may be a tubular pad element 40'", as shown in FIG. 3C. Also, although the invention is described with particular reference to a surface mount reed switch, it has applicability to other electronic components as will be readily appreciated by those skilled in the art,

We claim:

1. A surface mount electronic component comprising:
   a component body having a conductive lead extending outwardly therefrom along an axis; and
   a conductive pad element associated with and electrically connected to an outer end of the lead so as to provide a surface mounting foot, said surface mounting foot providing a continuous contacting surface for contacting a circuit board and supporting said component above said circuit board, said contacting surface having a width in a direction transverse to said axis which is greater than a width of said lead transverse to said axis, whereby said conductive pad element provides a stable support for said component to deter said component body from rolling over.

2. The surface mount electronic component of claim 1 wherein the pad element is separate from the lead before being associated therewith.

3. The surface mount electronic component of claim 1 wherein the pad element defines a surface mounting foot that is wider than a width of the component body transverse to said axis.

4. The surface mount electronic component of claim 1 wherein the pad element defines a rod-shaped member.

5. The surface mount electronic component of claim 4 wherein the pad element is separate from the lead before being associated therewith.

6. The surface mount electronic component of claim 5 wherein the pad element has an upper surface portion and a lower surface portion, the upper surface portion being attached to an underside of the associated lead, and the lower surface portion providing the surface mounting foot.

7. The surface mount electronic component of claim 4 wherein the pad element defines a surface mounting foot that is wider than a width of the component body transverse to said axis.

8. The surface mount electronic component of claim 4 wherein the rod-shaped member has a round cross-section.

9. The surface mount electronic component of claim 4 wherein the rod-shaped member has a square cross-section.

10. The surface mount electronic component of claim 4 wherein the rod-shaped member has a rectangular cross-section.

11. The surface mount electronic component of claim 4 wherein the rod-shaped member has a tubular cross-section.

12. The surface mount electronic component of claim 4 wherein the rod-shaped member is positioned transverse to the outer end of the associated lead.

13. The surface mount electronic component of claim 1 wherein the pad element has a generally flat lower surface defining the continuous contacting surface.

14. The surface mount electronic component of claim 13 wherein the pad element has a general flat upper surface whereat the pad element is electrically connected to the lead.

15. A surface mount electronic component comprising:
   a reed switch having an elongated reed switch body and a pair of switch leads extending out of the body along an elongated axis of said reed switch body such that inner ends of the switch leads define a switch gap within the reed switch body; and
   a conductive pad element associated with and electrically connected to an outer end of each of the leads so as to provide a surface mounting foot for each lead, said surface mounting feet providing continuous contacting surfaces for contacting a circuit board and supporting said component above said circuit board, each said contacting surface having a width in a direction transverse to said elongated axis of said reed switch body which is greater than a width of the associated lead transverse to said elongated axis,
   whereby said conductive pad elements provide a stable mounting surface for said reed switch to deter said reed switch body from rolling over, and provide connection of said leads to said circuit board without application of bending stresses on the leads.

16. The surface mount electronic component of claim 15 wherein the pad element is separate from the lead before being associated therewith.

17. The surface mount electronic component of claim 15 wherein the pad element defines a surface mounting foot that is wider than a width of the reed switch body transverse to said elongated axis.

18. The surface mount electronic component of claim 15 wherein the pad element defines a rod-shaped member.

19. The surface mount electronic component of claim 18 wherein the pad element is separate from the lead before being associated therewith.

20. The surface mount electronic component of claim 19 wherein the pad element has an upper surface portion and a lower surface portion, the upper surface portion being attached to an underside of the associated lead, and the lower surface portion providing the surface mounting foot.

21. The surface mount electronic component of claim 18 wherein the pad element defines a surface mounting foot that is wider than a width of the outer end of the associated lead.

22. The surface mount electronic component of claim 18 wherein the rod-shaped member has a round cross-section.

23. The surface mount electronic component of claim 18 wherein the rod-shaped member has a square cross-section.

24. The surface mount electronic component of claim 18 wherein the rod-shaped member has a rectangular cross-section.

25. The surface mount electronic component of claim 18 wherein the rod-shaped member has a tubular cross-section.

26. The surface mount electronic component of claim 18 wherein the rod-shaped member is positioned transverse to the outer end of the associated lead.

27. The surface mount electronic component of claim 15 wherein the pad element has a generally flat lower surface defining the continuous contacting surface.

28. The surface mount electronic component of claim 27 wherein the pad element has a general flat upper surface whereat the pad element is electrically connected to the lead.

29. A surface mount electronic component comprising:
   a component body having a conductive lead extending outwardly therefrom; and
   a rod-shaped member having elongated side surfaces and first and second ends, said rod-shaped member being associated with the lead, one of said elongated side surfaces of said rod-shaped member being attached to said lead, another of said elongated side surfaces of said rod-shaped member providing a continuous contacting surface for contacting a circuit board and supporting said component above said circuit board.

30. The surface mount electronic component of claim 29 wherein the rod-shaped member has a round cross-section.

31. The surface mount electronic component of claim 29 wherein the rod-shaped member has a square cross-section.

32. The surface mount electronic component of claim 29 wherein the rod-shaped member has a rectangular cross-section.

33. The surface mount electronic component of claim 29 wherein the rod-shaped member has a tubular cross-section.

34. The surface mount electronic component of claim 29 wherein the elongated dimension of said rod-shaped member is positioned transverse to an axis of the associated lead.

35. A reed switch and mounting, comprising:
   a reed switch having a reed switch body and switch leads extending out of the body along an axis, the inner ends of the switch lead defining a switch gap within the reed switch body; and
   a conductive pad element of magnetic material, associated with one of the leads so as to provide a surface mounting foot for the associated lead of the reed switch, wherein said surface mounting foot provides a continuous contacting surface for contacting a circuit board supporting said component above said circuit board, which also provides a magnetic path to increase magnetic sensitivity of said reed switch, said conductive pad element being positioned adjacent the associated lead, but outside a region adjacent said reed switch body, said region adjacent said reed switch body being defined as that region between planes extending from opposite ends of said reed switch body transverse to said axis.

36. The reed switch and mounting of claim 35, wherein said solid conductive pad element is of conductive material and provides an electrical connection for the associated lead.

37. The reed switch and mounting of claim 35 wherein the pad element is separate from the lead before being associated therewith.

38. The reed switch and mounting of claim 35 wherein the pad element defines a surface mounting foot that is wider than a width of the associated lead transverse to said axis.

39. The reed switch and mounting of claim 35 wherein the pad element defines a rod-shaped member.

40. The reed switch and mounting of claim 39 wherein the pad element is separate from the lead before being associated therewith.

41. The reed switch and mounting of claim 39 wherein the pad element defines a surface mounting foot that is wider than a width of the associated lead.

42. The reed switch and mounting of claim 39 wherein the rod-shaped member has a round cross-section.

43. The reed switch and mounting of claim 39 wherein the rod-shaped member has a square cross-section.

44. The reed switch and mounting of claim 39 wherein the rod-shaped member has a rectangular cross-section.

45. The reed switch and mounting of claim 39 wherein the rod-shaped member has a tubular cross-section.

46. The reed switch and mounting of claim 39 wherein the rod-shaped member is positioned transverse to the outer end of the associated lead.

47. The reed switch and mounting of claim 35 wherein the pad element has a generally flat lower surface defining the continuous contacting surface.

48. The reed switch and mounting of claim 47 wherein the pad element has a generally flat upper surface whereat the pad element is electrically connected to the lead.

* * * * *